(12) United States Patent
Fukuzawa et al.

(10) Patent No.: US 12,218,161 B2
(45) Date of Patent: Feb. 4, 2025

(54) OPTICAL SENSOR, OPTICAL SENSOR UNIT, OPTICAL SENSOR DEVICE, AND INFORMATION TERMINAL DEVICE

(71) Applicant: TDK CORPORATION, Tokyo (JP)

(72) Inventors: Hideaki Fukuzawa, Tokyo (JP); Dai Matsuoka, Tokyo (JP); Tomohito Mizuno, Tokyo (JP); Tetsuya Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 431 days.

(21) Appl. No.: 17/559,135

(22) Filed: Dec. 22, 2021

(65) Prior Publication Data

US 2022/0208820 A1 Jun. 30, 2022

(30) Foreign Application Priority Data

| Dec. 24, 2020 | (JP) | ................................. 2020-214583 |
| Jun. 23, 2021 | (JP) | ................................. 2021-103981 |
| Sep. 22, 2021 | (JP) | ................................. 2021-154423 |

(51) Int. Cl.
| *H01L 27/146* | (2006.01) |
| *H10B 61/00* | (2023.01) |
| *H10N 50/10* | (2023.01) |
| *H10N 50/80* | (2023.01) |
| *G11C 11/16* | (2006.01) |

(52) U.S. Cl.
CPC ....... *H01L 27/14621* (2013.01); *H10B 61/00* (2023.02); *H10N 50/10* (2023.02); *H10N 50/80* (2023.02); *G11C 11/161* (2013.01)

(58) Field of Classification Search
CPC ....... H10N 50/80; G11C 11/161; H10B 61/00

USPC .......................................................... 527/421
See application file for complete search history.

(56) References Cited

U.S. PATENT DOCUMENTS

| 6,925,261 B2 | 8/2005 | Haruyama |
| 9,842,874 B2 | 12/2017 | Nakata |
| 11,703,380 B2 | 7/2023 | Fukuzawa et al. |
| 11,722,222 B2 | 8/2023 | Fukuzawa et al. |
| 2001/0040713 A1 | 11/2001 | Haruyama |
| 2002/0063919 A1 | 5/2002 | Kovar et al. |
| 2004/0213511 A1 | 10/2004 | Scholz |
| 2007/0223149 A1 | 9/2007 | Kim et al. |
| 2008/0284010 A1 | 11/2008 | Romig |
| 2010/0008675 A1 | 1/2010 | De Dobbelaere |

(Continued)

FOREIGN PATENT DOCUMENTS

| JP | H08-078703 A | 3/1996 |
| JP | 2001-292107 A | 10/2001 |

OTHER PUBLICATIONS

Jan. 5, 2024 U.S. Office Action issued in U.S. Appl. No. 18/210,333.

(Continued)

*Primary Examiner* — Jami Valentine Miller
(74) *Attorney, Agent, or Firm* — Oliff PLC

(57) ABSTRACT

An optical sensor includes a wavelength filter configured to transmit light in a specific wavelength range and a magnetic element including a first ferromagnetic layer, a second ferromagnetic layer, and a spacer layer sandwiched between the first ferromagnetic layer and the second ferromagnetic layer. The light passing through the wavelength filter is applied to the magnetic element and the light applied to the magnetic element is detected.

16 Claims, 6 Drawing Sheets

(56) References Cited

U.S. PATENT DOCUMENTS

| | | | |
|---|---|---|---|
| 2015/0333839 A1* | 11/2015 | Li | H04B 10/532 398/152 |
| 2021/0159392 A1 | 5/2021 | Prasad et al. | |
| 2021/0359201 A1 | 11/2021 | Sun et al. | |
| 2021/0404867 A1* | 12/2021 | Jaiswal | H04N 25/76 |
| 2022/0010423 A1* | 1/2022 | Suzuki | C23C 16/52 |
| 2022/0068537 A1 | 3/2022 | Mizuno et al. | |
| 2022/0252449 A1* | 8/2022 | Degawa | G01J 1/0488 |
| 2022/0260425 A1 | 8/2022 | Jacob et al. | |
| 2023/0333022 A1* | 10/2023 | Fukuzawa | G01N 21/35 |
| 2024/0021231 A1 | 1/2024 | Jacob et al. | |

OTHER PUBLICATIONS

Azim et al., "Optical Receiver With Helicity-Dependent Magetization Reversal", IEEE Transactions on Magnetics, Jan. 2019, vol. 55, No. 1, pp. 1-6.

Machida et al., "Spin Transfer Switching and MR Properties of Co/Pt Multilayered Free Layers for Submicron Sized Magneto-Optical Light Modulation Device", IEEE Transactions of Magnetics, Jun. 2010, vol. 46, No. 6, pp. 2171-2174.

Aug. 15, 2022 Office Action issued in U.S. Appl. No. 17/507,143.

Nov. 4, 2022 Office Action issued in U.S. Appl. No. 17/507,088.

Dec. 16, 2022 Notice of Allowance Issued in U.S. Appl. No. 17/507,143.

U.S. Appl. No. 17/507,143, filed Oct. 21, 2021 in the name of Hideaki Fukuzawa.

U.S. Appl. No. 17/507,088, filed Oct. 21, 2021 in the name of Hideaki Fukuzawa.

U.S. Appl. No. 17/845,050, filed Jun. 21, 2022 in the name of Takekazu Yamane.

Chen et al., "All-Optical Switching of Magnetic Tunnel Junctions with Single Subpicosecond Laser Pulses", Physical Review Applied 7, 021001, (2017).

Mar. 8, 2024 Office Action issued in U.S. Appl. No. 18/328,817.

Aug. 8, 2024 Office Action issued in U.S. Appl. No. 18/328,817.

\* cited by examiner

FIG. 9

FIG. 10

OPTICAL SENSOR, OPTICAL SENSOR UNIT, OPTICAL SENSOR DEVICE, AND INFORMATION TERMINAL DEVICE

CROSS-REFERENCE TO RELATED APPLICATION

Priority is claimed on Japanese Patent Application No. 2020-214583, filed Dec. 24, 2020, Japanese Patent Application No. 2021-103981, filed Jun. 23, 2021, and Japanese Patent Application No. 2021-154423, filed Sep. 22, 2021, the content of which is incorporated herein by reference.

BACKGROUND

The present disclosure is an optical sensor, an optical sensor unit, an optical sensor device, and an information terminal device.

Image sensors are used in camera devices and the demand for the image sensors is increasing year by year. An image sensor is an imaging sensor that converts light into an electrical signal.

For example, in Patent Document 1, an optical sensor using a semiconductor pn junction and an image sensor using the optical sensor are disclosed.

PATENT DOCUMENTS

[Patent Document 1] U.S. Pat. No. 9,842,874

SUMMARY

Optical sensors using semiconductor pn junctions are widely used, but new breakthroughs are required for further development.

It is desirable to provide a novel optical sensor, optical sensor unit, optical sensor device, and information terminal device.

The following means is provided.

According to a first aspect, there is provided an optical sensor including: a wavelength filter configured to transmit light in a specific wavelength range; and a magnetic element including a first ferromagnetic layer, a second ferromagnetic layer, and a spacer layer sandwiched between the first ferromagnetic layer and the second ferromagnetic layer, wherein the light passing through the wavelength filter is applied to the magnetic element and the light applied to the magnetic element is detected.

According to a second aspect, there is provided an optical sensor unit including: a plurality of optical sensors according to the above-described aspect.

According to a third aspect, there is provided an optical sensor device including: the optical sensor according to the above-described aspect; and a semiconductor circuit electrically connected to the magnetic element of the optical sensor.

According to a fourth aspect, there is provided an information terminal device including: the optical sensor according to the above-described aspect.

The optical sensor, the optical sensor unit, the optical sensor device, and the information terminal device according to the above-described aspects operate with a new principle.

BRIEF DESCRIPTION OF THE DRAWINGS

FIG. 9 is a diagram showing an example of a specific configuration of an optical sensor unit according to a second modified example.

FIG. 10 is a diagram showing an example of a specific configuration of an optical sensor unit according to a third modified example.

DETAILED DESCRIPTION

Figure 1:
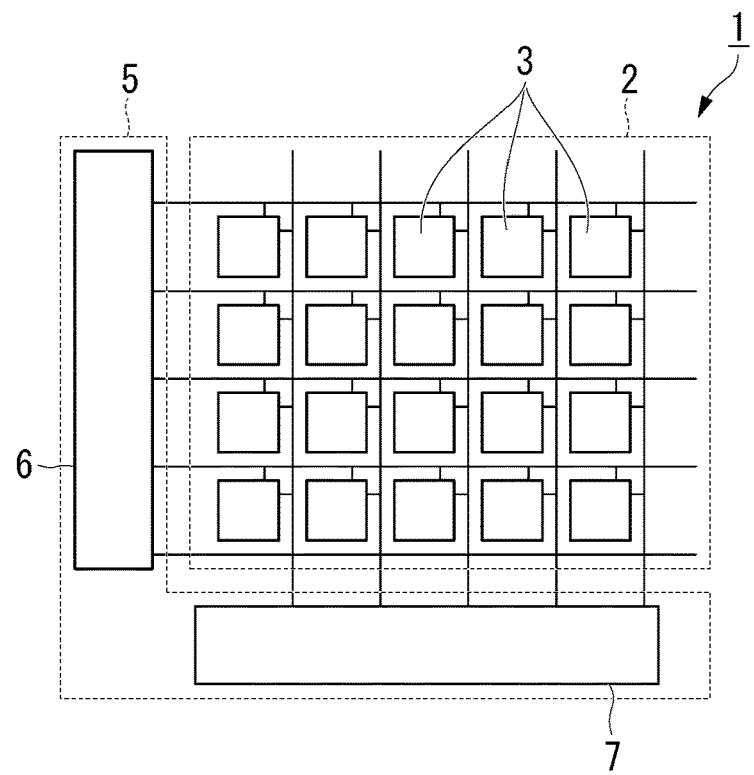
FIG. 1 is a conceptual diagram of an optical sensor device according to a first embodiment.

Hereinafter, the present embodiment will be described in detail with reference to the drawings as appropriate. In the drawings used in the following description, featured parts may be enlarged parts for convenience so that the features of the present disclosure are easier to understand, and dimensional ratios and the like of the respective components may be different from actual ones. Materials, dimensions, and the like exemplified in the following description are examples, the present disclosure is not limited thereto, and modifications can be appropriately made in a range in which advantageous effects of the present disclosure are exhibited.

Directions will be defined. A lamination direction of a magnetic element 30 is defined as a z direction, one direction within a plane orthogonal to the z direction is defined as an x direction, and a direction orthogonal to the x direction and the z direction is defined as a y direction. Hereinafter, a +z direction may be expressed as an "upward" direction and a −z direction may be expressed as a "downward" direction. The +z direction is a direction from a circuit board 10 to the magnetic element 30. The upward and downward directions do not always coincide with a direction in which gravity is applied.

First Embodiment

FIG. 1 is a conceptual diagram of an optical sensor device 1 according to a first embodiment. The optical sensor device 1 shown in FIG. 1 includes an optical sensor unit 2 and a semiconductor circuit 5.

The optical sensor unit 2 includes, for example, a plurality of optical sensors 3. The optical sensors 3 are arrayed two-dimensionally in, for example, a matrix. Each of the optical sensors 3 is connected to a first selection line extending in a row direction and a second selection line extending in a column direction. The optical sensor unit 2 detects light with a plurality of optical sensors 3 and replaces the detected light with an electrical signal. The light in the present specification is not limited to visible light and also includes infrared light having a wavelength longer than that of the visible light and ultraviolet light having a wavelength shorter than that of the visible light. The wavelength of the visible light is, for example, 380 nm or more and less than 800 nm. The wavelength of the infrared light is, for example, 800 nm or more and 1 mm or less. The wavelength of the ultraviolet light is, for example, 200 nm or more and less than 380 nm.

The semiconductor circuit 5 is arranged, for example, outside of the outer circumference of the optical sensor unit 2. Also, the semiconductor circuit 5 may be formed on a circuit board 10 to be described below and may be located at a position overlapping the optical sensor unit 2 in the z direction.

The semiconductor circuit 5 is electrically connected to each of the optical sensors 3. The semiconductor circuit 5 calculates an electrical signal sent from the optical sensor unit 2. The semiconductor circuit 5 includes, for example, a row decoder 6 and a column decoder 7. The row decoder 6 and the column decoder 7 identify the position of the optical sensor 3 that has detected the light. The semiconductor circuit 5 may include a memory, a calculation circuit, a register, and the like in addition to the row decoder 6 and the column decoder 7.

Figure 2:
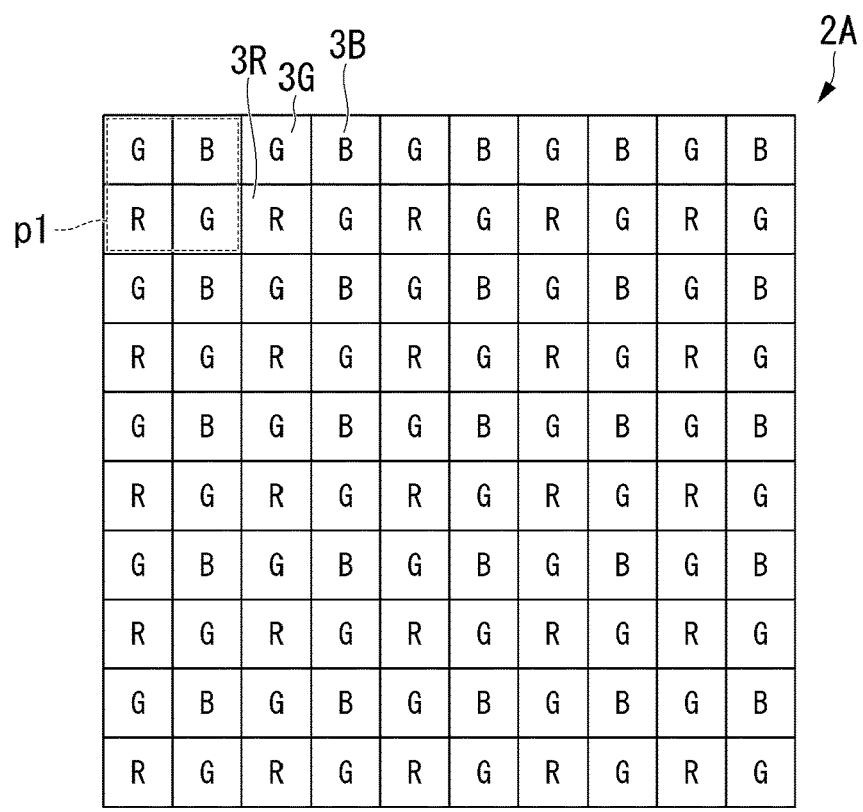
FIG. 2 is a diagram showing an example of a specific configuration of an optical sensor unit according to the first embodiment.

FIG. 2 shows an example of a specific configuration of the optical sensor unit. An optical sensor unit 2A shown in FIG. 2 includes a plurality of pixels p1. Each of the pixels p1 includes, for example, a red sensor 3R, a green sensor 3G, and a blue sensor 3B. Although an example in which two green sensors 3G having high visual sensitivity are arranged in one pixel p1 is shown in the optical sensor unit 2A shown in FIG. 2, the present disclosure is not limited to this case.

Each of the red sensor 3R, the green sensor 3G, and the blue sensor 3B detects light in a specific wavelength range within a wavelength range of 380 nm or more and less than 800 nm. The blue sensor 3B detects, for example, light in a wavelength range of 380 nm or more and less than 490 nm. The green sensor 3G detects, for example, light in a wavelength range of 490 nm or more and less than 590 nm. The red sensor 3R detects, for example, light in a wavelength range of 590 nm or more and 800 nm or less.

In the case shown in FIG. 2, for example, assuming that the red sensor 3R is an example of a first optical sensor, one of the blue sensor 3B and the green sensor 3G is an example of a second optical sensor and the other of the blue sensor 3B and the green sensor 3G, which is not selected, is an example of a third optical sensor. The first optical sensor is an optical sensor having a wavelength filter that transmits light in a first wavelength range. The second optical sensor is an optical sensor having a wavelength filter that transmits light in a second wavelength range. The third optical sensor is an optical sensor having a wavelength filter that transmits light in a third wavelength range. The first wavelength range, the second wavelength range, and the third wavelength range are different wavelength ranges.

Figure 3:
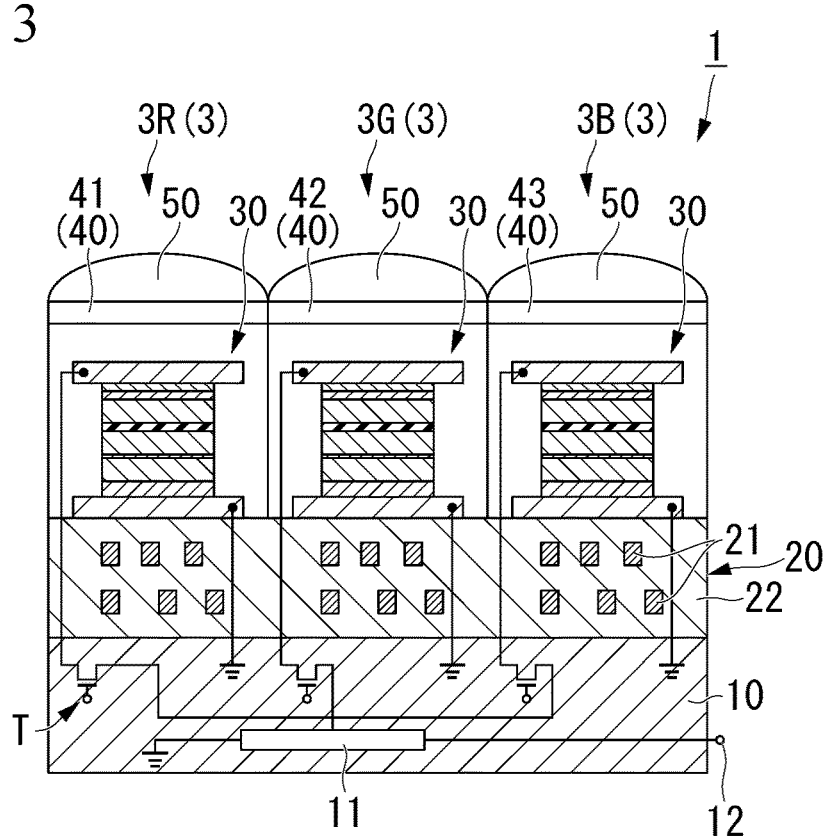
FIG. 3 is a conceptual diagram of a cross-section of the optical sensor device according to the first embodiment.

FIG. 3 is a conceptual diagram of a cross-section of the optical sensor device 1 according to the first embodiment. The optical sensor device 1 includes, for example, a circuit board 10, a wiring layer 20, and a plurality of optical sensors 3. Each of the wiring layer 20 and the plurality of optical sensors 3 is formed on the circuit board 10.

The above-described semiconductor circuit 5 is formed on the circuit board 10. The circuit board 10 includes, for example, an analog-to-digital converter 11 and an output terminal 12. An electrical signal sent from the optical sensor 3 is replaced with digital data by the analog-to-digital converter 11 and the digital data is output from the output terminal 12.

The wiring layer 20 includes two or more wirings 21. There is an interlayer insulating film 22 between the two or more wirings 21. The wiring 21 is electrically connected between each of the optical sensors 3 and the circuit board 10 and is electrically connected to each calculation circuit formed on the circuit board 10. Each of the optical sensors 3 and the circuit board 10 are connected, for example, via through-wiring passing through the interlayer insulating film 22 in the z direction. Noise can be reduced by shortening an inter-wiring distance between each of the optical sensors 3 and the circuit board 10.

The wiring 21 has conductivity. The wiring 21 is, for example, Al, Cu, or the like. The interlayer insulating film 22 is an insulator that provides insulation between wirings of multilayer wiring and between elements. The interlayer insulating film 22 is, for example, an oxide of Si, Al, or Mg, a nitride, or an oxynitride. The interlayer insulating film 22 includes, for example, silicon oxide ($SiO_x$), silicon nitride ($SiN_x$), silicon carbide (SiC), chromium nitride, silicon carbide (SiCN), silicon oxynitride (SiON), aluminum oxide ($Al_2O_3$), zirconium oxide ($ZrO_x$), or the like.

Each of the plurality of optical sensors 3 includes, for example, a magnetic element 30, a wavelength filter 40, and a lens 50. The magnetic element 30 is irradiated with light transmitted through the wavelength filter 40. The magnetic element 30 detects the light applied to the magnetic element 30. Specifically, the magnetic element 30 replaces the light applied to the magnetic element 30 with an electrical signal. The wavelength filter 40 selects light having a specific wavelength and transmits the light in the specific wavelength range. The lens 50 condenses light toward the magnetic element 30. Although one magnetic element 30 is arranged below one wavelength filter 40 in the optical sensor 3 shown in FIG. 3, a plurality of magnetic elements 30 may be arranged below one wavelength filter 40.

The plurality of optical sensors 3 include a red sensor 3R, a green sensor 3G, and a blue sensor 3B. Each of the red sensor 3R, the green sensor 3G, and the blue sensor 3B is a visible optical sensor. For example, each of the red sensor 3R, the green sensor 3G, and the blue sensor 3B has the same configuration as the magnetic element 30 and the lens 50 and a wavelength range of light transmitted by the wavelength filter 40 differs according to each sensor. The red sensor 3R has a wavelength filter 41. The green sensor 3G has a wavelength filter 42. The blue sensor 3B has a wavelength filter 43.

Each of the wavelength filter 41, the wavelength filter 42, and the wavelength filter 43 transmits, for example, light in a specific wavelength range within a wavelength range of 380 nm or more and less than 800 nm. The wavelength filter 41 transmits, for example, light in a wavelength range of 590 nm or more and less than 800 nm. The wavelength filter 42 transmits, for example, light in a wavelength range of 490 nm or more and less than 590 nm. The wavelength filter 43 transmits, for example, light in a wavelength range of 380 nm or more and less than 490 nm.

Figure 4:
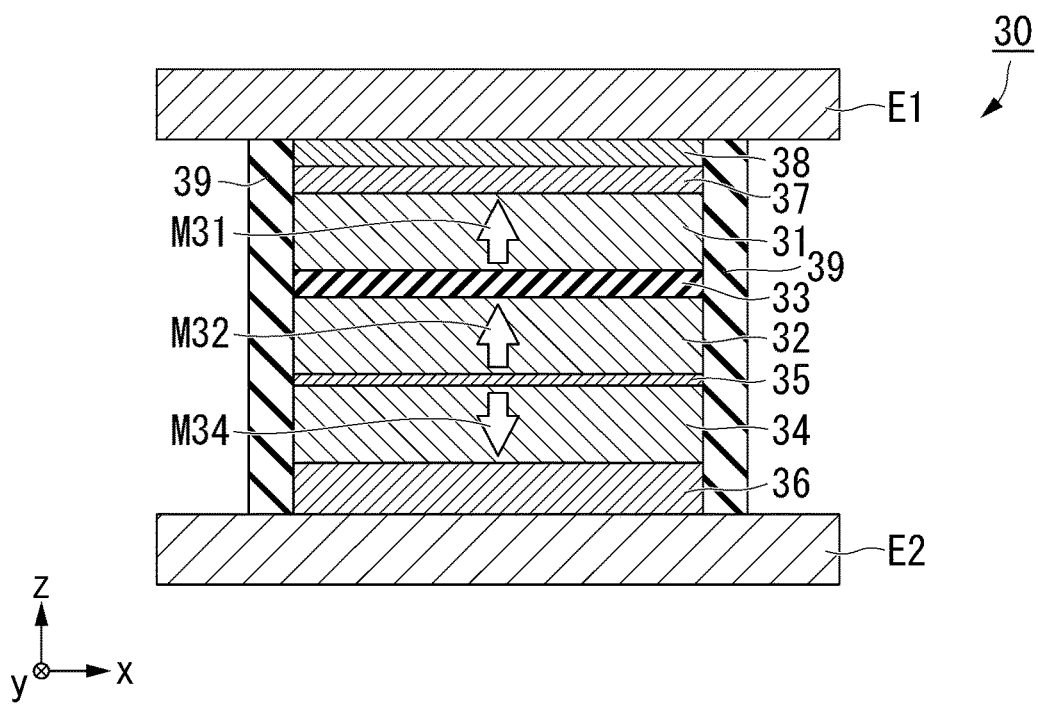
FIG. 4 is a cross-sectional view of a magnetic element according to the first embodiment.

FIG. 4 is a cross-sectional view of the magnetic element 30 according to the first embodiment. In FIG. 4, a first electrode E1 and a second electrode E2 are shown together and the direction of magnetization in an initial state of a ferromagnet is indicated by an arrow.

The magnetic element 30 includes at least a first ferromagnetic layer 31, a second ferromagnetic layer 32, and a spacer layer 33. The spacer layer 33 is located between the first ferromagnetic layer 31 and the second ferromagnetic layer 32. In addition to these, the magnetic element 30 may include a third ferromagnetic layer 34, a magnetic coupling layer 35, a base layer 36, a perpendicular magnetization inducing layer 37, a cap layer 38, and a sidewall insulating layer 39.

The magnetic element 30 is, for example, a magnetic tunnel junction (MTJ) element in which the spacer layer 33 is made of an insulating material. In this case, the magnetic element 30 is a photodetection element whose resistance value changes when it is irradiated with light from the outside. In this case, in the magnetic element 30, a resistance value in the z direction (a resistance value when a current flows in the z direction) changes in accordance with a relative change between a state of magnetization M31 of the first ferromagnetic layer 31 and a state of magnetization M32 of the second ferromagnetic layer 32. Such an element is also called a magnetoresistance effect element.

The first ferromagnetic layer 31 is a photodetection layer whose magnetization state changes when it is irradiated with light from the outside. The first ferromagnetic layer 31 is also called a magnetization free layer. The magnetization free layer is a layer including a magnetic material whose magnetization state changes when prescribed external energy is applied. The prescribed external energy is, for example, light from the outside which is applied, a current flowing in the z direction of the magnetic element 30, or an external magnetic field. The state of the magnetization M31 of the first ferromagnetic layer 31 changes with an intensity of light that is applied and the optical sensor 3 can replace the light with an electrical signal.

The first ferromagnetic layer 31 includes a ferromagnet. The first ferromagnetic layer 31 includes at least one of magnetic elements such as Co, Fe, and Ni. The first ferromagnetic layer 31 may include nonmagnetic elements such as B, Mg, Hf, and Gd in addition to the above-mentioned magnetic elements. The first ferromagnetic layer 31 may be, for example, an alloy including a magnetic element and a nonmagnetic element. The first ferromagnetic layer 31 may include a plurality of layers. The first ferromagnetic layer 31 is, for example, a CoFeB alloy, a laminate in which a CoFeB alloy layer is sandwiched between Fe layers, and a laminate in which a CoFeB alloy layer is sandwiched between CoFe layers.

The first ferromagnetic layer 31 may be an in-plane magnetization film having an axis of easy magnetization in a direction within a film surface (any direction within the xy plane) or may be a perpendicular magnetization film having an axis of easy magnetization in a direction (the z direction) perpendicular to the film surface.

A thickness of the first ferromagnetic layer 31 is, for example, 1 nm or more and 5 nm or less. The thickness of the first ferromagnetic layer 31 may be, for example, 1 nm or more and 2 nm or less. If the thickness of the first ferromagnetic layer 31 is thin when the first ferromagnetic layer 31 is a perpendicular magnetization film, the effect of applying perpendicular magnetic anisotropy from the layers above and below the first ferromagnetic layer 31 is strengthened and perpendicular magnetic anisotropy of the first ferromagnetic layer 31 increases. That is, when the perpendicular magnetic anisotropy of the first ferromagnetic layer 31 is high, a force for the magnetization M31 to return in the z direction is strengthened. On the other hand, when the thickness of the first ferromagnetic layer 31 is thick, the effect of applying the perpendicular magnetic anisotropy from the layers above and below the first ferromagnetic layer 31 is relatively weakened and the perpendicular magnetic anisotropy of the first ferromagnetic layer 31 is weakened.

The volume of a ferromagnet becomes small when the thickness of the first ferromagnetic layer 31 becomes thin. The volume of a ferromagnet becomes large when the thickness of the first ferromagnetic layer 31 becomes thick. The susceptibility of the magnetization of the first ferromagnetic layer 31 when external energy is applied is inversely proportional to a product (KuV) of the magnetic anisotropy (Ku) and the volume (V) of the first ferromagnetic layer 31. That is, when the product of the magnetic anisotropy and the volume of the first ferromagnetic layer 31 becomes small, the reactivity to light increases. From this point of view, the magnetic anisotropy of the first ferromagnetic layer 31 may be appropriately designed and then the volume of the first ferromagnetic layer 31 may be reduced so that the reaction to light increases.

When the thickness of the first ferromagnetic layer 31 is thicker than 2 nm, an insertion layer made of, for example, Mo and W, may be provided within the first ferromagnetic layer 31. That is, the first ferromagnetic layer 31 may be a laminate in which the ferromagnetic layer, the insertion layer, and the ferromagnetic layer are laminated in that order in the z direction. Interfacial magnetic anisotropy at an interface between the insertion layer and the ferromagnetic layer enhances the perpendicular magnetic anisotropy of the entire first ferromagnetic layer 31. The thickness of the insertion layer is, for example, 0.1 nm to 0.6 nm.

The second ferromagnetic layer 32 is a magnetization fixed layer. The magnetization fixed layer is a layer made of a magnetic material whose magnetization state is less likely to change than that of the magnetization free layer when prescribed external energy is applied. For example, the direction of magnetization of the magnetization fixed layer is less likely to change than that of the magnetization free layer when prescribed external energy is applied. Also, for example, the magnitude of magnetization of the magnetization fixed layer is less likely to change than that of the magnetization free layer when prescribed external energy is applied. The coercivity of the second ferromagnetic layer 32 is, for example, greater than the coercivity of the first ferromagnetic layer 31. The second ferromagnetic layer 32 has an axis of easy magnetization in the same direction as the first ferromagnetic layer 31. The second ferromagnetic layer 32 may be an in-plane magnetization film or a perpendicular magnetization film.

A material constituting the second ferromagnetic layer 32 is, for example, similar to that of the first ferromagnetic layer 31. The second ferromagnetic layer 32 may be, for example, a laminate in which Co having a thickness of 0.4 nm to 1.0 nm, Mo having a thickness of 0.1 nm to 0.5 nm, a CoFeB alloy having a thickness of 0.3 nm to 1.0 nm, and Fe having a thickness of 0.3 nm to 1.0 nm are laminated in order.

The magnetization of the second ferromagnetic layer 32 may be fixed by, for example, magnetic coupling with the third ferromagnetic layer 34 via the magnetic coupling layer 35. In this case, a combination of the second ferromagnetic layer 32, the magnetic coupling layer 35, and the third ferromagnetic layer 34 may also be called a magnetization fixed layer.

The third ferromagnetic layer 34 is magnetically coupled to, for example, the second ferromagnetic layer 32. The magnetic coupling is, for example, antiferromagnetic coupling and is caused by the Ruderman-Kittel-Kasuya-Yosida (RKKY) interaction. A material constituting the third ferromagnetic layer 34 is, for example, similar to that of the first ferromagnetic layer 31. The third ferromagnetic layer 34 is, for example, a laminated film in which Co and Pt are alternately laminated or a laminated film in which Co and Ni are alternately laminated. The magnetic coupling layer 35 is, for example, Ru, Ir, or the like. The thickness of the magnetic coupling layer 35 is, for example, a thickness at which the second ferromagnetic layer 32 and the third ferromagnetic layer 34 are antiferromagnetically coupled by the RKKY interaction.

The spacer layer 33 is a nonmagnetic layer arranged between the first ferromagnetic layer 31 and the second ferromagnetic layer 32. The spacer layer 33 is formed by a layer including a conductor, an insulator, or a semiconductor or a layer including a current carrying point formed by a conductor in the insulator. A thickness of the spacer layer 33 can be adjusted in accordance with orientation directions of the magnetization M31 of the first ferromagnetic layer 31 and the magnetization M32 of the second ferromagnetic layer 32 in an initial state to be described below.

For example, when the spacer layer 33 is made of an insulator, the magnetic element 30 has a magnetic tunnel junction (MTJ) including the first ferromagnetic layer 31, the spacer layer 33, and the second ferromagnetic layer 32. Such an element is called an MTJ element. In this case, the magnetic element 30 can exhibit a tunnel magnetoresistance (TMR) effect. For example, when the spacer layer 33 is made of a metal, the magnetic element 30 can exhibit a giant magnetoresistance (GMR) effect. Such an element is called a GMR element. The magnetic element 30 may be called an MTJ element, a GMR element, or the like, which differs according to the constituent material of the spacer layer 33, but these may also be collectively called magnetoresistance effect elements.

When the spacer layer 33 is made of an insulating material, materials including aluminum oxide, magnesium oxide, titanium oxide, silicon oxide, and the like can be used. Also, the above insulating materials may include elements such as Al, B, Si, and Mg and magnetic elements such as Co, Fe, and Ni. A high magnetoresistance change rate can be obtained by adjusting the thickness of the spacer layer 33 so that a strong TMR effect is exhibited between the first ferromagnetic layer 31 and the second ferromagnetic layer 32. In order to use the TMR effect efficiently, the thickness of the spacer layer 33 may be about 0.5 to 5.0 nm or about 1.0 to 2.5 nm.

When the spacer layer 33 is made of a nonmagnetic conductive material, a conductive material such as Cu, Ag, Au, or Ru can be used. In order to use the GMR effect efficiently, the thickness of the spacer layer 33 may be about 0.5 to 5.0 nm or about 2.0 to 3.0 nm.

When the spacer layer 33 is made of a nonmagnetic semiconductor material, a material such as zinc oxide, indium oxide, tin oxide, germanium oxide, gallium oxide, or indium tin oxide (ITO) can be used. In this case, the thickness of the spacer layer 33 may be about 1.0 to 4.0 nm.

When a layer including a current carrying point made of a conductor within a nonmagnetic insulator is applied as the spacer layer 33, a structure may be formed to include a current carrying point made of a nonmagnetic conductor of Cu, Au, Al, or the like within the nonmagnetic insulator made of aluminum oxide or magnesium oxide. Also, the conductor may be made of a magnetic element such as Co, Fe, or Ni. In this case, the thickness of the spacer layer 33 may be about 1.0 to 2.5 nm. The current carrying point is, for example, a columnar body having a diameter of 1 nm or more and 5 nm or less when viewed from a direction perpendicular to a film surface.

A base layer 36 shown in FIG. 4 is, for example, on the second electrode E2. The base layer 36 is a seed layer or a buffer layer. The seed layer enhances the crystallinity of the layer laminated on the seed layer. The seed layer is, for example, Pt, Ru, Hf, Zr, or NiFeCr. A thickness of the seed layer is, for example, 1 nm or more and 5 nm or less. The buffer layer is a layer that alleviates lattice mismatch between different crystals. The buffer layer is, for example, Ta, Ti, W, Zr, Hf, or a nitride of these elements. A thickness of the buffer layer is, for example, 1 nm or more and 5 nm or less.

The perpendicular magnetization inducing layer 37 is formed when the first ferromagnetic layer 31 is a perpendicular magnetization film. The perpendicular magnetization inducing layer 37 is laminated on the first ferromagnetic layer 31. The perpendicular magnetization inducing layer 37 induces perpendicular magnetic anisotropy of the first ferromagnetic layer 31. The perpendicular magnetization inducing layer 37 is, for example, magnesium oxide, W, Ta, Mo, or the like. When the perpendicular magnetization inducing layer 37 is magnesium oxide, magnesium oxide may be oxygen-deficient to increase conductivity. A thickness of the perpendicular magnetization inducing layer 37 is, for example, 0.5 nm or more and 2.0 nm or less.

The cap layer 38 is between the first ferromagnetic layer 31 and the first electrode E1. The cap layer 38 prevents damage to the lower layer during the process and enhances the crystallinity of the lower layer during annealing. The thickness of the cap layer 38 is, for example, 3 nm or less so that the first ferromagnetic layer 31 is irradiated with sufficient light.

The sidewall insulating layer 39 covers the periphery of the laminate including the first ferromagnetic layer 31 and the second ferromagnetic layer 32. The sidewall insulating layer 39 is made of, for example, a material similar to that of the interlayer insulating film 22.

The first electrode E1 has, for example, transparency with respect to a wavelength range of light applied to the magnetic element 30. The first electrode E1 is a transparent electrode including a transparent electrode material of an oxide such as indium tin oxide (ITO), indium zinc oxide (IZO), zinc oxide (ZnO), or indium gallium zinc oxide (IGZO). The first electrode E1 may be configured to have a plurality of columnar metals among these transparent electrode materials. In this case, a film thickness of the first electrode E1 is, for example, 10 nm to 300 nm. It is not essential to use the above-mentioned transparent electrode material as the first electrode E1 and light from the outside may be allowed to reach the first ferromagnetic layer 31 using a metallic material such as Au, Cu, or Al with a thin film thickness. When a metal is used as the material of the first electrode E1, the film thickness of the first electrode E1 is, for example, 3 to 10 nm. In particular, Au has higher transmittance for light having a wavelength near a blue wavelength of light than other metallic materials. Also, the first electrode E1 may have an antireflection film on an irradiation surface irradiated with light.

The second electrode E2 is made of a conductive material. The second electrode E2 is made of, for example, a metal such as Cu, Al, or Au. Ta and/or Ti may be laminated on the top and bottom of the above metals. Also, a laminated film of Cu and Ta, a laminated film of Ta, Cu, and Ti, and a laminated film of Ta, Cu, and TaN may be used. Also, TiN and/or TaN may be used as the second electrode E2. A film thickness of the second electrode E2 is, for example, 200 nm to 800 nm. The second electrode E2 may be made transparent to light applied to the magnetic element 30. As the material of the second electrode E2, as in the first electrode E1, for example, a transparent electrode material of an oxide such as indium tin oxide (ITO), indium zinc oxide (IZO), zinc oxide (ZnO), or indium gallium zinc oxide (IGZO) may be used. Even if light is applied from the first electrode E1, the light may reach the second electrode E2 according to the intensity of the light. In this case, the second electrode E2 is configured to include a transparent electrode material of an oxide, so that the reflection of light at an interface between the second electrode E2 and a layer in contact with the second electrode E2 can be limited as compared with the case where the second electrode E2 is made of a metal.

The magnetic element 30 is manufactured in a laminating process, an annealing process, and a processing process on each layer. First, layers are laminated in the order of the base layer 36, the third ferromagnetic layer 34, the magnetic coupling layer 35, the second ferromagnetic layer 32, the spacer layer 33, the first ferromagnetic layer 31, the perpendicular magnetization inducing layer 37, and the cap layer 38 on the second electrode E2. Each layer is formed by, for example, sputtering.

Subsequently, the laminated film is annealed. An annealing temperature is, for example, 250° C. to 450° C. When the laminated film is formed on the circuit board 10, the laminated film may be annealed at 400° C. or higher. Subsequently, the laminated film is processed into a prescribed columnar body by photolithography and etching. The columnar body may be a cylindrical body or a prismatic body. For example, the shortest width when the columnar body is viewed from the z direction may be 10 nm or more and 2000 nm or less or 30 nm or more and 500 nm or less.

Subsequently, an insulating layer is formed to cover the side surface of the columnar body. The insulating layer is the sidewall insulating layer 39. The sidewall insulating layer 39 may be laminated a plurality of times. Subsequently, the upper surface of the cap layer 38 is exposed from the sidewall insulating layer 39 by chemical mechanical polishing (CMP) and the first electrode E1 is manufactured on the cap layer 38. In the above-described process, the magnetic element 30 is obtained.

Next, an operation of each of the optical sensors 3 according to the first embodiment will be described. Light applied to the optical sensor 3 is condensed by each of lenses 50 and reaches the magnetic element 30 via the wavelength filters 41, 42, and 43.

Because light is applied via the wavelength filter 41, the magnetic element 30 of the red sensor 3R is irradiated with red light (light in a wavelength range of 590 nm or more and less than 800 nm). Because light is applied via the wavelength filter 42, the magnetic element 30 of the green sensor 3G is irradiated with green light (light in a wavelength range of 490 nm or more and less than 590 nm). Because light is applied via the wavelength filter 43, the magnetic element 30 of the blue sensor 3B is irradiated with blue light (light in a wavelength range of 380 nm or more and less than 490 nm).

An output voltage from the magnetic element 30 changes with an intensity of light applied to the first ferromagnetic layer 31. Although the exact mechanism by which the output voltage from the magnetic element 30 changes with the irradiation of light has not yet been clarified, it is possible to take into account, for example, the following two mechanisms.

Figure 5:
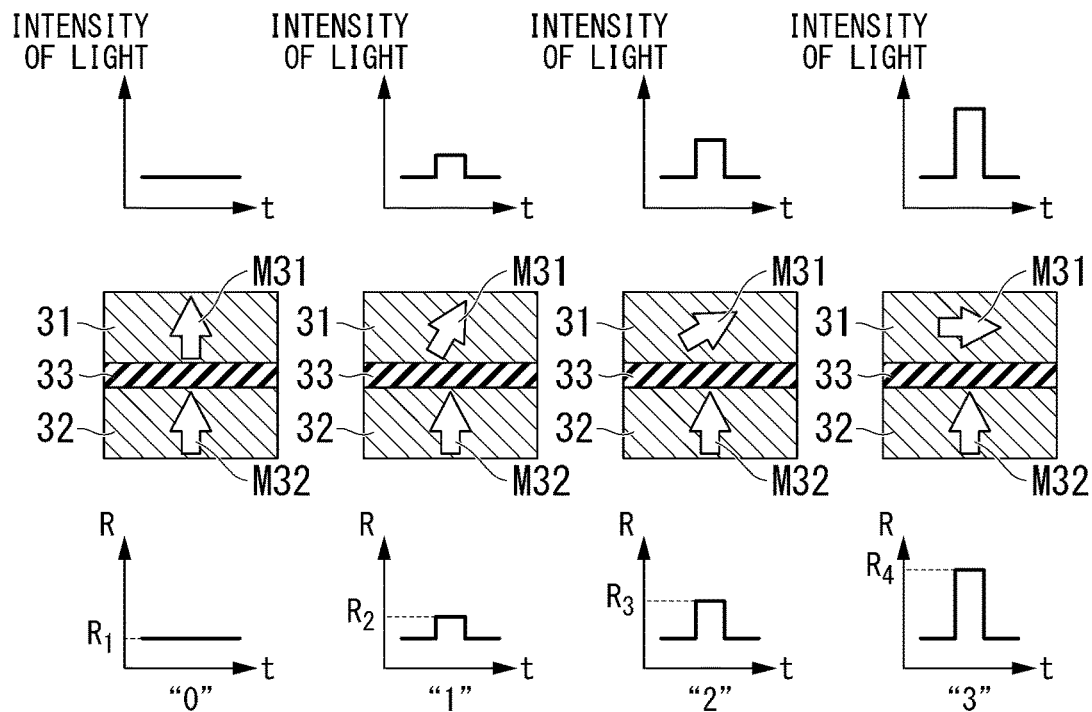
FIG. 5 is a diagram for describing a first mechanism of an operation of an optical sensor according to the first embodiment.

FIG. 5 is a diagram for describing a first mechanism of the operation of the optical sensor 3 according to the first embodiment. In the upper graph of FIG. 5, the vertical axis represents an intensity of light with which the first ferromagnetic layer 31 is irradiated and the horizontal axis represents time. In the lower graph of FIG. 5, the vertical axis represents a resistance value of the magnetic element 30 in the z direction, and the horizontal axis represents time.

First, in a state in which the first ferromagnetic layer 31 is irradiated with light of the first intensity (hereinafter referred to as an initial state), there is a relationship in which the magnetization M31 of the first ferromagnetic layer 31 and the magnetization M32 of the second ferromagnetic layer 32 are parallel, a resistance value of the magnetic element 30 in the z direction is a first resistance value $R_1$, and a magnitude of an output voltage from the magnetic element 30 is a first value. The first intensity may be a case where the intensity of the light applied to the first ferromagnetic layer 31 is zero.

A resistance value of the magnetic element 30 in the z direction is obtained by allowing a sense current to flow in the z direction of the magnetic element 30 to generate a voltage across both ends of the magnetic element 30 in the z direction and using Ohm's law from a voltage value. The output voltage from the magnetic element 30 is generated between the first electrode E1 and the second electrode E2. In the case of the example shown in FIG. 5, the sense current may flow from the first ferromagnetic layer 31 to the second ferromagnetic layer 32. By allowing a sense current to flow in this direction, spin transfer torque in a direction that is the same as that of the magnetization M32 of the second ferromagnetic layer 32 acts on the magnetization M31 of the first ferromagnetic layer 31 and the magnetization M31 and the magnetization M32 are parallel in the initial state. Also, by allowing a sense current to flow in this direction, it is possible to prevent the magnetization M31 of the first ferromagnetic layer 31 from being inverted during the operation.

Subsequently, the intensity of light applied to the first ferromagnetic layer 31 changes. The magnetization M31 of the first ferromagnetic layer 31 is tilted from the initial state due to external energy from the irradiation of light. An angle between the direction of the magnetization M31 of the first ferromagnetic layer 31 in a state in which the first ferromagnetic layer 31 is not irradiated with light and the direction of the magnetization M31 in a state in which the first ferromagnetic layer 31 is irradiated with light is greater than 0° and less than 90°.

When the magnetization M31 of the first ferromagnetic layer 31 is tilted from the initial state, the resistance value of the magnetoresistance effect element 30 in the z direction changes. The output voltage from the magnetic element 30 changes. For example, in accordance with a tilt of the magnetization M31 of the first ferromagnetic layer 31, the resistance value of the magnetic element 30 in the z direction changes to a second resistance value $R_2$, a third resistance value $R_3$, and a fourth resistance value $R_4$ and the output voltage from the magnetic element 30 changes to a second value, a third value, and a fourth value. The resistance value increases in the order of the first resistance value $R_1$, the second resistance value $R_2$, the third resistance value $R_3$, and the fourth resistance value $R_4$. The output voltage from the magnetic element 30 increases in the order of the first value, the second value, the third value, and the fourth value.

In the optical sensor 3, when the intensity of light applied to the magnetic element 30 changes, the output voltage from the magnetic element 30 (the resistance value of the magnetic element 30 in the z direction) changes. When a threshold value of the output voltage (the resistance value of the magnetic element 30) from the magnetic element 30 is defined in the analog-to-digital converter 11 at a plurality of levels, the optical sensor device 1 can output information of four values such as, for example, a first value (a first resistance value $R_1$) of "0", a second value (a second resistance value $R_2$) of "1", a third value (a third resistance value $R_3$) of "2", and a fourth value (a fourth resistance value $R_4$) of "3." Although the case where four values are read is shown as an example here, the number of values to be read can be freely designed by setting the threshold value of the output voltage (the resistance value of the magnetic element 30) from the magnetic element 30. Also, when the analog-to-digital converter 11 is not used, an analog value may be output as it is.

Because spin transfer torque in a direction, which is the same as that of the magnetization M32 of the second ferromagnetic layer 32, acts on the magnetization M31 of the first ferromagnetic layer 31, the magnetization M31 tilted from the initial state returns to the initial state if the first ferromagnetic layer 31 is not irradiated with light. When the magnetization M31 returns to the initial state, the resistance value of the magnetic element 30 in the z direction returns to the first resistance value $R_1$.

Although the case where the magnetization M31 and the magnetization M32 are parallel in the initial state has been described as an example here, the magnetization M31 and the magnetization M32 may be antiparallel in the initial state. In this case, the resistance value of the magnetic element 30 in the z direction decreases as the magnetization M31 is tilted (as a change in an angle from the initial state of the magnetization M31 increases). When the initial state is the case where the magnetization M31 and the magnetization M32 are antiparallel, the sense current may flow from the second ferromagnetic layer 32 toward the first ferromagnetic layer 31. By allowing the sense current to flow in this direction, spin transfer torque in a direction opposite to that of the magnetization M32 of the second ferromagnetic layer 32 acts on the magnetization M31 of the first ferromagnetic layer 31 and the magnetization M31 and the magnetization M32 become antiparallel in the initial state.

Figure 6:
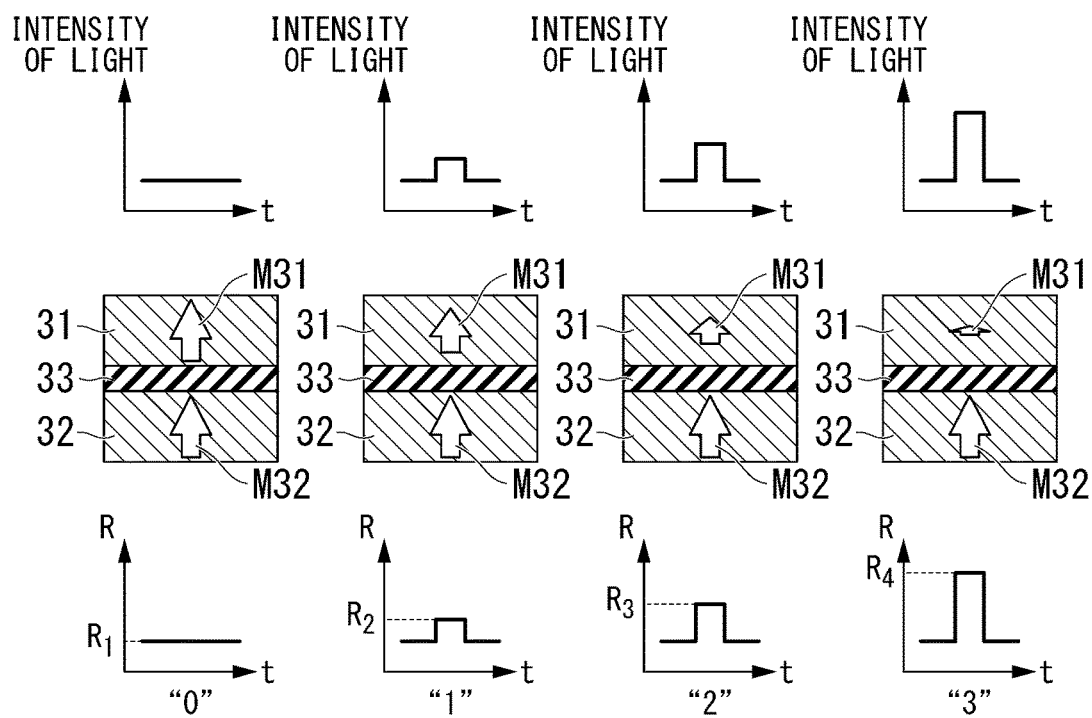
FIG. 6 is a diagram for describing a second mechanism of an operation of the optical sensor according to the first embodiment.

FIG. 6 is a diagram for describing a second mechanism of an operation of the optical sensor 3 according to the first embodiment. In the upper graph of FIG. 6, the vertical axis represents an intensity of light applied to the first ferromagnetic layer 31 and the horizontal axis represents time. In the lower graph of FIG. 6, the vertical axis represents a resistance value of the magnetic element 30 in the z direction and the horizontal axis represents time.

The initial state shown in FIG. 6 is similar to the initial state shown in FIG. 5. Also, in the case of the example shown in FIG. 6, the sense current may flow from the first ferromagnetic layer 31 toward the second ferromagnetic layer 32. By allowing a sense current to flow in this direction, spin transfer torque in a direction, which is the same as that of the magnetization M32 of the second ferromagnetic layer 32, acts on the magnetization M31 of the first ferromagnetic layer 31, and the initial state is maintained.

Subsequently, the intensity of the light applied to the first ferromagnetic layer 31 changes. A magnitude of the magnetization M31 of the first ferromagnetic layer 31 decreases from the initial state due to external energy from the irradiation of light. When the magnetization M31 of the first ferromagnetic layer 31 decreases from the initial state, the resistance value of the magnetoresistance effect element 30 in the z direction changes. An output voltage from the magnetic element 30 changes. For example, in accordance with the magnitude of the magnetization M31 of the first ferromagnetic layer 31, the resistance value of the magnetic element 30 in the z direction changes to the second resistance value $R_2$, the third resistance value $R_3$, and the fourth resistance value $R_4$. The output voltage from the magnetic element 30 changes to the second value, the third value, and the fourth value. The resistance value increases in the order of the first resistance value $R_1$, the second resistance value $R_2$, the third resistance value $R_3$, and the fourth resistance value $R_4$. The output voltage from the magnetic element 30 increases in the order of the first value, the second value, the third value, and the fourth value. As in the case of FIG. 5, the optical sensor 3 outputs a difference between these output voltages (resistance values) as multi-valued or analog data.

When the intensity of the light applied to the first ferromagnetic layer 31 returns to the first intensity, the magnitude of the magnetization M31 of the first ferromagnetic layer 31 returns to the original magnitude and the optical sensor 3 returns to the initial state. That is, the resistance value of the magnetic element 30 in the z direction returns to the first resistance value $R_1$.

Also, in FIG. 6, the magnetization M31 and the magnetization M32 may be antiparallel in the initial state. In this case, the resistance value of the magnetic element 30 in the z direction decreases as the magnitude of the magnetization M31 decreases. When the initial state is the case where the magnetization M31 and the magnetization M32 are antiparallel, the sense current may flow from the second ferromagnetic layer 32 toward the first ferromagnetic layer 31.

The optical sensor device 1 measures the output voltage (the resistance value of the magnetic element 30) from the magnetic element 30 of each optical sensor 3 of the optical sensor unit 2 together with position information obtained by the row decoder 6 and the column decoder 7 and reads light applied to the optical sensor unit 2. The optical sensor device 1 is used, for example, in an image sensor or the like.

Also, the magnetization M31 of the first ferromagnetic layer 31 is likely to change with respect to light irradiation as the volume of the first ferromagnetic layer 31 decreases. That is, as the volume of the first ferromagnetic layer 31 decreases, the magnetization M31 of the first ferromagnetic layer 31 is likely to be tilted due to the irradiation of light or is likely to decrease due to the irradiation of light. In other words, if the volume of the first ferromagnetic layer 31 decreases, the magnetization M31 can change even with a small amount of light. That is, the optical sensor device 1 according to the first embodiment can detect light with high sensitivity.

More precisely, the changeability of the magnetization M31 is determined by a magnitude of the product (KuV) of the magnetic anisotropy (Ku) and the volume (V) of the first ferromagnetic layer 31. As KuV decreases, the magnetization M31 changes even if an amount of light is smaller. As KuV increases, the magnetization M31 does not change if the amount of light is not larger. That is, KuV of the first ferromagnetic layer 31 is designed in accordance with an amount of light applied from the outside for use in the application. When photon detection is assumed in relation to extremely small amounts of ultra-small light, it is possible to detect small amounts of light by decreasing KuV of the first ferromagnetic layer 31. This is a great advantage because detection of such a small amount of light becomes difficult in a conventional pn junction semiconductor when an element size is reduced. That is, in order to decrease KuV, the volume of the first ferromagnetic layer 31 is decreased, i.e., an element area is decreased or the thickness of the first ferromagnetic layer 31 is decreased, so that photon detection is also possible.

Also, if the size of the optical sensor 3 is small, many optical sensors 3 can be arranged in the same area. As the number of optical sensors 3 arranged in the same area increases, the resolution of the optical sensor device 1 increases. Also, if the size of the optical sensor 3 is small, a prescribed number of optical sensors 3 can be arranged in a small area. That is, it is possible to reduce the cost of manufacturing the optical sensor device 1 having a prescribed number of pixels.

Although the first embodiment has been described in detail with reference to the drawings, the first embodiment is not limited to this example.

First Modified Example

Figure 7:
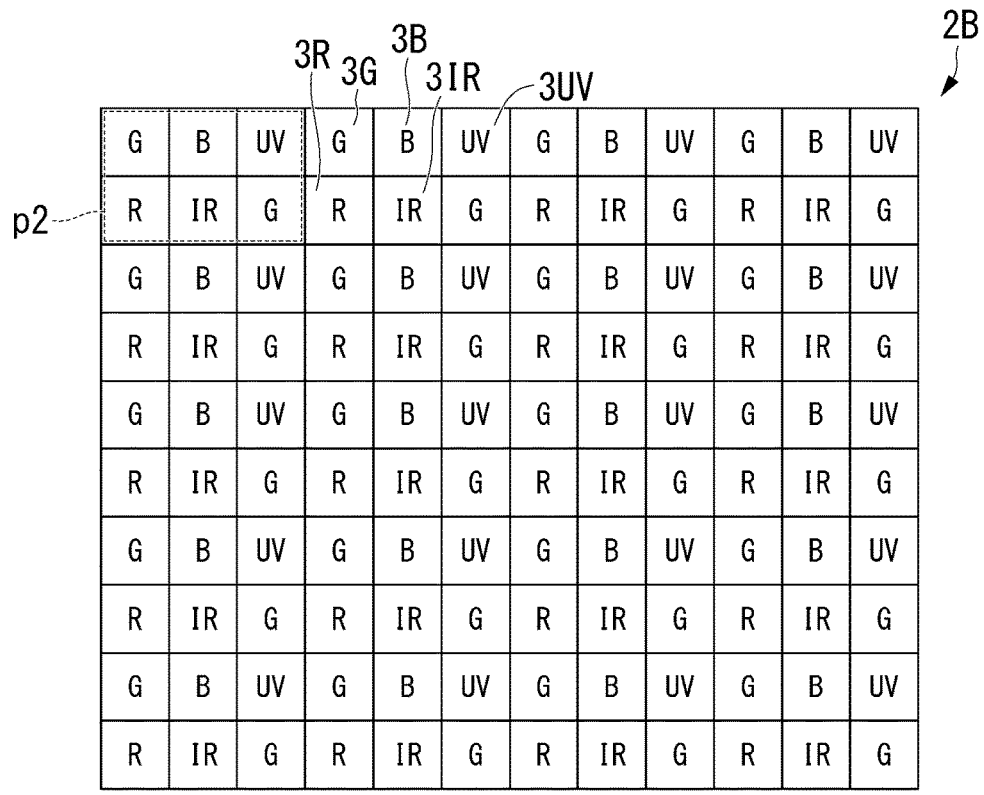
FIG. 7 is a diagram showing an example of a specific configuration of an optical sensor unit according to a first modified example.

FIG. 7 shows an example of a specific configuration of an optical sensor unit 2B according to a first modified example. The optical sensor unit 2B of the first modified example has a plurality of pixels p2. Each of the pixels p2 includes, for example, a red sensor 3R, a green sensor 3G, a blue sensor 3B, an infrared sensor 3IR, and an ultraviolet sensor 3UV. The optical sensor unit 2B shown in FIG. 7 is different from the optical sensor unit 2A shown in FIG. 2 in that the optical sensor unit 2B has the infrared sensor 3IR and the ultraviolet sensor 3UV. In the first modified example, components similar to those of FIGS. 2 to 4 are denoted by the same reference signs and a description thereof will be omitted.

The infrared sensor 3IR detects light in a specific wavelength range within a wavelength range of 800 nm or more and 1 mm or less. The ultraviolet sensor 3UV detects light in a specific wavelength range within a wavelength range of 200 nm or more and less than 380 nm. In the example shown in FIG. 7, for example, the red sensor 3R, the green sensor 3G, and the blue sensor 3B can be regarded as first optical sensors, the infrared sensor 3IR can be regarded as a second optical sensor, and the ultraviolet sensor 3UV can be regarded as a third optical sensor.

Figure 8:
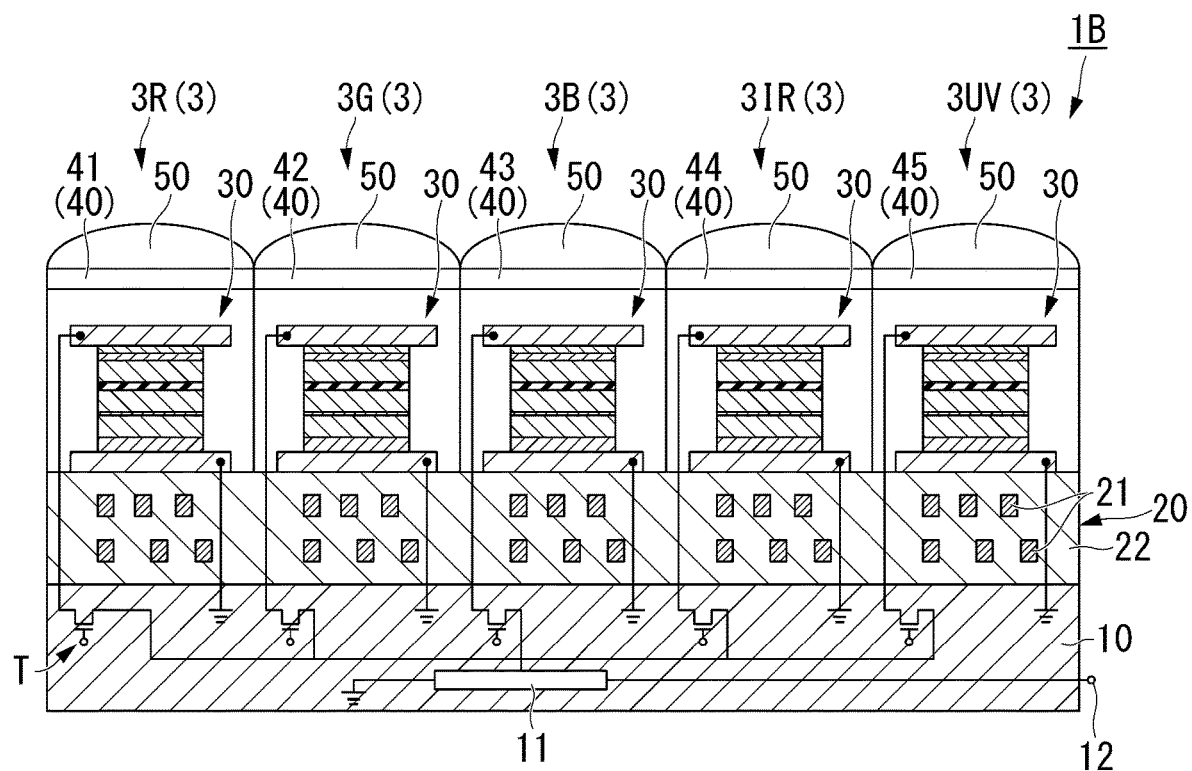
FIG. 8 is a conceptual diagram of a cross-section of an optical sensor device according to the first modified example.

FIG. 8 is a conceptual diagram of a cross-section of an optical sensor device 1B according to the first modified example. The optical sensor device 1B includes, for example, a circuit board 10, a wiring layer 20, and a plurality of optical sensors 3.

Each of the plurality of optical sensors 3 is any one of the red sensor 3R, the green sensor 3G, the blue sensor 3B, the infrared sensor 3IR, and the ultraviolet sensor 3UV. Each of the red sensor 3R, the green sensor 3G, the blue sensor 3B, the infrared sensor 3IR, and the ultraviolet sensor 3UV has the same configuration as the magnetic element 30 and the lens 50, and a wavelength range of light transmitted by a wavelength filter 40 differs according to each sensor.

The red sensor 3R has a wavelength filter 41. The green sensor 3G has a wavelength filter 42. The blue sensor 3B has a wavelength filter 43. The infrared sensor 3IR has a wavelength filter 44. The ultraviolet sensor 3UV has a wavelength filter 45. The wavelength filter 44 transmits light in a specific wavelength range within a wavelength range of, for example, 800 nm or more and 1 mm or less. The wavelength filter 45 transmits light in a specific wavelength range within a wavelength range of, for example, 200 nm or more and less than 380 nm.

The infrared sensor 3IR and the ultraviolet sensor 3UV are examples of the optical sensor 3 and perform an operation similar to that of the optical sensor 3. Because a magnetic element 30 of the infrared sensor 3IR is irradiated with light via the wavelength filter 44, it is irradiated with infrared light (light in a specific wavelength range of 800 nm or more and 1 mm or less). Because a magnetic element 30 of the ultraviolet sensor 3UV is irradiated with light via the wavelength filter 45, it is irradiated with ultraviolet light (light in a specific wavelength range of 200 nm or more and less than 380 nm).

The optical sensor device 1B according to the first modified example has effects similar to those of the optical sensor device 1 according to the first embodiment. Also, the optical sensor device 1B can simultaneously detect infrared light and ultraviolet light other than visible light. Also, the optical sensor device 1B can detect visible light, infrared light, and ultraviolet light only by changing the wavelength range of the light transmitted by the wavelength filter 40, and can be manufactured cost-effectively.

Figures 9, 10:
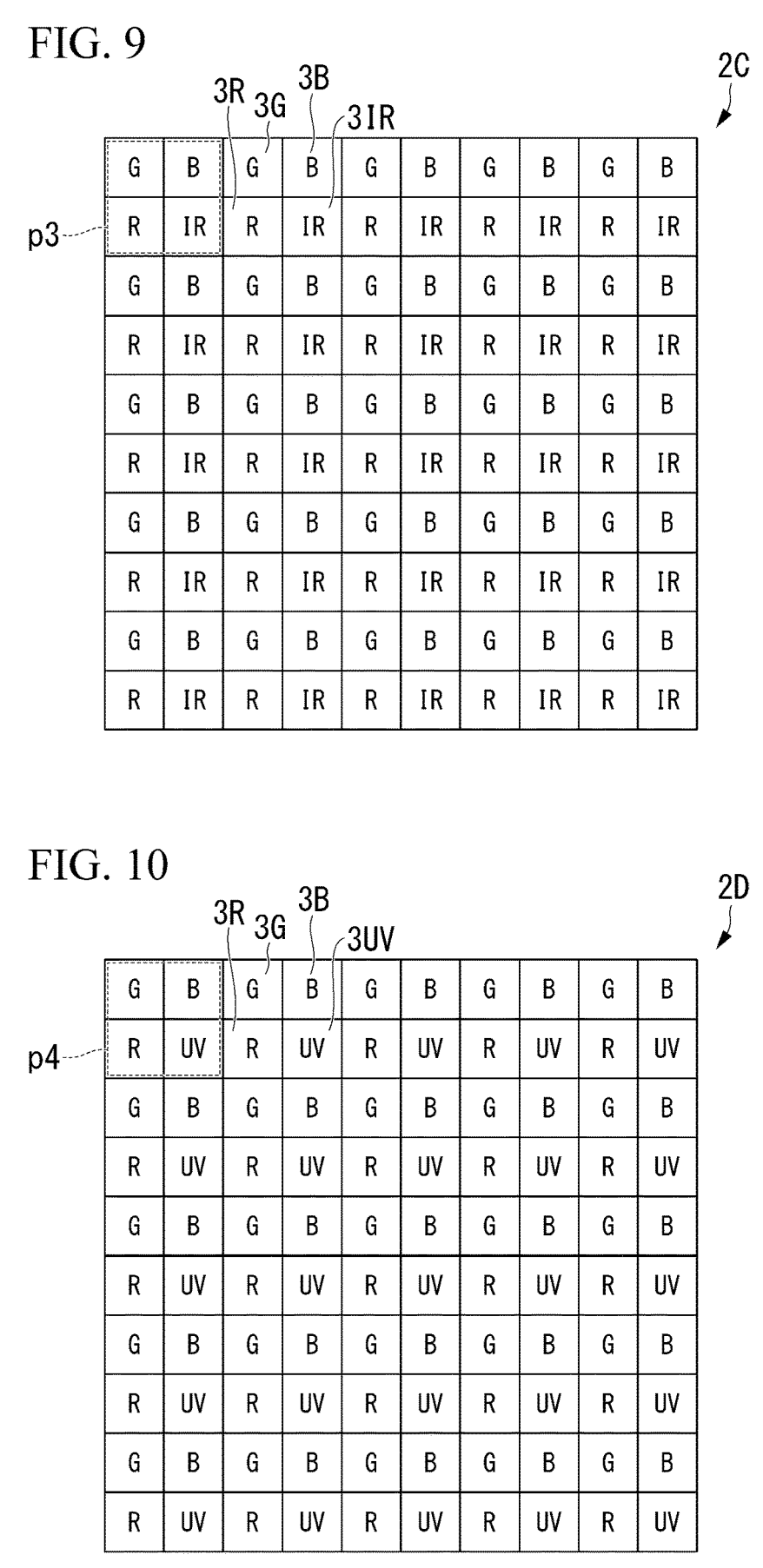

Also, as in the optical sensor unit 2C shown in FIG. 9, one pixel p3 may include a red sensor 3R, a green sensor 3G, a blue sensor 3B, and an infrared sensor 3IR. Also, as in the optical sensor unit 2D shown in FIG. 10, one pixel p4 may include a red sensor 3R, a green sensor 3G, a blue sensor 3B, and an ultraviolet sensor 3UV. Also, the optical sensors 3 constituting the optical sensor unit may detect light in the same wavelength range. In this case, the wavelength range that is detected by each optical sensor 3 is not particularly limited.

Figure 11:
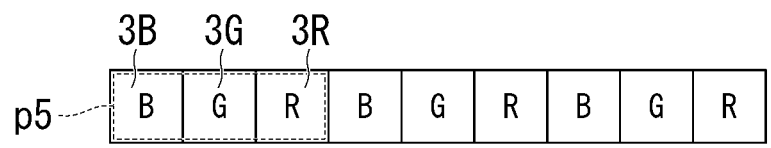
FIG. 11 is a diagram showing an example of a specific configuration of an optical sensor unit according to a fourth modified example.

Although the example in which the optical sensors 3 are arranged two-dimensionally has been described above, the optical sensors 3 may be arranged one-dimensionally as shown in FIG. 11. Although an example in which one pixel p5 includes a red sensor 3R, a green sensor 3G, and a blue sensor 3B arranged one-dimensionally is shown in FIG. 11, the pixel p5 may not have any one of the red sensor 3R, the green sensor 3G, and the blue sensor 3B or may have an infrared sensor 3IR or an ultraviolet sensor 3UV. Also, the optical sensors 3 may detect light in the same wavelength range and the wavelength range that is detected by each optical sensor 3 is not particularly limited.

Figure 12:
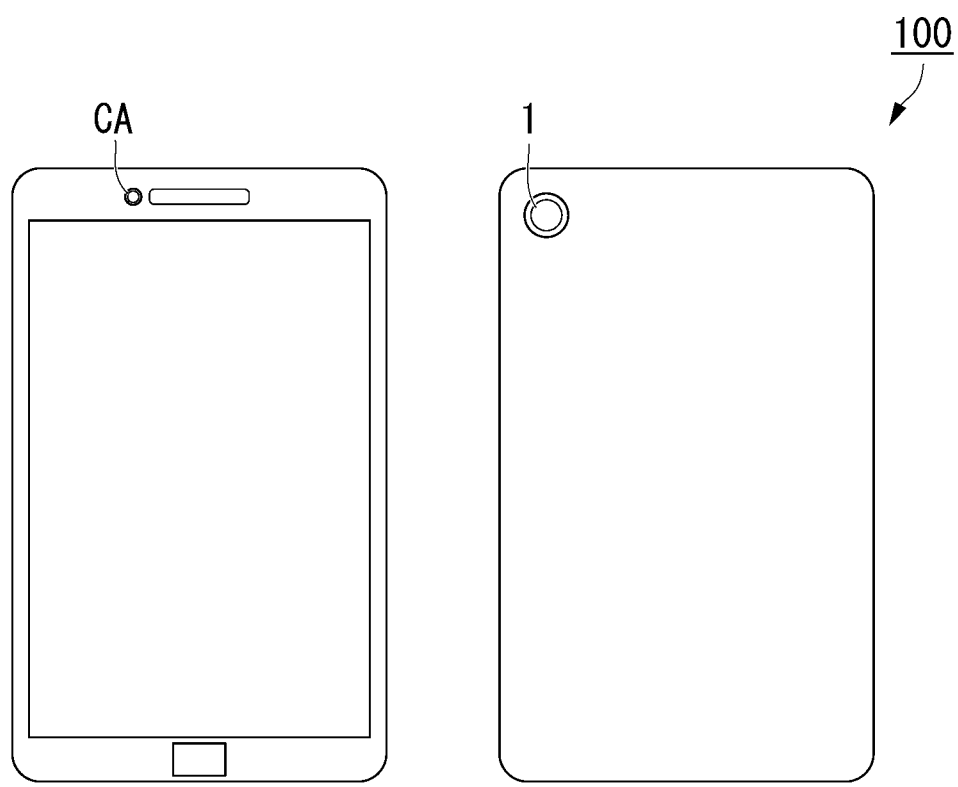
FIG. 12 is a conceptual diagram of an information terminal device according to the first embodiment.

The above-described optical sensor devices 1 and 1B can be used, for example, in an information terminal device. FIG. 12 is a schematic view of an example of the information terminal device 100. The left side of FIG. 12 is a front surface of the information terminal device 100 and the right side of FIG. 12 is a back surface of the information terminal device 100. The information terminal device 100 has a camera CA. The above-described optical sensor devices 1 and 1B can be used as an image sensor of this camera. Although a smartphone is shown as an example of the information terminal device 100 in FIG. 12, the present disclosure is not limited to this case. The information terminal device 100 is, for example, a tablet, a personal computer, a digital camera, or the like, in addition to the smartphone.

The present disclosure is not limited to the above-described embodiments and modified examples and various modifications and changes can be made within the scope of the subject matter of the present disclosure described within the scope of the claims.

What is claimed is:
1. An optical sensor comprising:
   a wavelength filter configured to transmit light in a specific wavelength range; and
   a magnetic element including a first ferromagnetic layer, a second ferromagnetic layer, and a spacer layer sandwiched between the first ferromagnetic layer and the second ferromagnetic layer, wherein the light in the specific wavelength range transmitted through the wavelength filter is applied to the magnetic element and the light in the specific wavelength range applied to the magnetic element is detected.

2. The optical sensor according to claim 1, wherein the wavelength filter transmits the light in the specific wavelength range within a wavelength range of 380 nm or more and less than 800 nm.

3. The optical sensor according to claim 1, wherein the wavelength filter transmits the light in the specific wavelength range within a wavelength range of 800 nm or more and 1 mm or less.

4. The optical sensor according to claim 1, wherein the wavelength filter transmits the light in the specific wavelength range within a wavelength range of 200 nm or more and 380 nm or less.

5. An optical sensor unit comprising:
a plurality of optical sensors according to claim 1.

6. The optical sensor unit according to claim 5, wherein at least a first optical sensor having the wavelength filter configured to transmit light in a first wavelength range and a second optical sensor having the wavelength filter configured to transmit light in a second wavelength range are provided as the optical sensors.

7. The optical sensor unit according to claim 6,
wherein the first wavelength range is a specific wavelength range within a wavelength range of 380 nm or more and less than 800 nm, and
wherein the second wavelength range is a specific wavelength range within a wavelength range of 800 nm or more and 1 mm or less.

8. The optical sensor unit according to claim 6,
wherein a third optical sensor having the wavelength filter configured to transmit light in a third wavelength range is further provided as the optical sensor, and
wherein the third wavelength range is a specific wavelength range within a wavelength range of 200 nm or more and less than 380 nm.

9. The optical sensor unit according to claim 7,
wherein a third optical sensor having the wavelength filter configured to transmit light in a third wavelength range is further provided as the optical sensor, and
wherein the third wavelength range is a specific wavelength range within a wavelength range of 200 nm or more and less than 380 nm.

10. The optical sensor unit according to claim 5, wherein the optical sensors are arrayed one-dimensionally.

11. The optical sensor unit according to claim 6, wherein the optical sensors are arrayed one-dimensionally.

12. The optical sensor unit according to claim 5, wherein the optical sensors are arrayed two-dimensionally.

13. The optical sensor unit according to claim 6, wherein the optical sensors are arrayed two-dimensionally.

14. An optical sensor device comprising:
the optical sensor according to claim 1; and
a semiconductor circuit electrically connected to the magnetic element of the optical sensor.

15. The optical sensor device according to claim 14, wherein the optical sensor is on the semiconductor circuit.

16. An information terminal device comprising:
the optical sensor according to claim 1.

* * * * *